United States Patent
Muranaka

(10) Patent No.: US 10,340,888 B2
(45) Date of Patent: Jul. 2, 2019

(54) ELASTIC WAVE FILTER, DUPLEXER, AND ELASTIC WAVE FILTER MODULE

(71) Applicant: Murata Manufacturing Co., Ltd., Nagaokakyo-shi, Kyoto-fu (JP)

(72) Inventor: Hiroshi Muranaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/963,562

(22) Filed: Apr. 26, 2018

(65) Prior Publication Data

US 2018/0248537 A1  Aug. 30, 2018

Related U.S. Application Data

(63) Continuation of application No. PCT/JP2016/074384, filed on Aug. 22, 2016.

(30) Foreign Application Priority Data

Nov. 18, 2015 (JP) .................. 2015-225726

(51) Int. Cl.
| | |
|---|---|
| H03H 9/02 | (2006.01) |
| H03H 9/05 | (2006.01) |
| H03H 9/25 | (2006.01) |
| H03H 9/64 | (2006.01) |
| H03H 9/72 | (2006.01) |
| H03H 9/145 | (2006.01) |

(52) U.S. Cl.
CPC ...... *H03H 9/6489* (2013.01); *H03H 9/02874* (2013.01); *H03H 9/02913* (2013.01);
(Continued)

(58) Field of Classification Search
CPC ........... H03H 9/02559; H03H 9/02874; H03H 9/02905; H03H 9/02913; H03H 9/02992;
(Continued)

(56) References Cited

U.S. PATENT DOCUMENTS

| | | | |
|---|---|---|---|
| 7,400,216 B2* | 7/2008 | Fuse ...................... | H03H 9/725 333/133 |
| 7,477,117 B2* | 1/2009 | Pitschi ................. | H03H 9/0057 310/313 A |

(Continued)

FOREIGN PATENT DOCUMENTS

| | | |
|---|---|---|
| JP | 05-167387 A | 7/1993 |
| JP | 2004-096250 A | 3/2004 |

(Continued)

OTHER PUBLICATIONS

Official Communication issued in International Patent Application No. PCT/JP2016/074384, dated Nov. 15, 2016.

*Primary Examiner* — Barbara Summons
(74) *Attorney, Agent, or Firm* — Keating & Bennett, LLP

(57) ABSTRACT

An elastic wave filter includes a piezoelectric substrate, an IDT electrode provided on the piezoelectric substrate, a first shield electrode provided on the piezoelectric substrate, a first insulating film laminated on the piezoelectric substrate and extending onto the first shield electrode, a first signal terminal provided on the first insulating film, a second signal terminal provided on the piezoelectric substrate, and a first ground terminal provided on the piezoelectric substrate and connected to a ground potential. The first shield electrode is not electrically connected to the IDT electrode and the first and second signal terminals. The first signal terminal is included in the first shield electrode when seen from above. One of the first signal terminal and the second signal terminal is an output terminal and the other thereof is an input terminal.

20 Claims, 13 Drawing Sheets

(52) U.S. Cl.
CPC ........ *H03H 9/02992* (2013.01); *H03H 9/059* (2013.01); *H03H 9/145* (2013.01); *H03H 9/25* (2013.01); *H03H 9/6483* (2013.01); *H03H 9/725* (2013.01); *H03H 9/02559* (2013.01)

(58) Field of Classification Search
CPC .......... H03H 9/059; H03H 9/145; H03H 9/25; H03H 9/6483; H03H 9/6489; H03H 9/6493; H03H 9/725
USPC ........................ 333/133, 193–196; 310/313 B
See application file for complete search history.

(56) References Cited

U.S. PATENT DOCUMENTS

| | | | |
|---|---|---|---|
| 7,733,196 B2* | 6/2010 | Tsurunari | H03H 9/0576 333/133 |
| 2002/0158708 A1* | 10/2002 | Inoue | H03H 9/0542 333/133 |
| 2003/0025576 A1* | 2/2003 | Takamine | H03H 9/0042 333/193 |
| 2003/0030512 A1* | 2/2003 | Takamine | H03H 9/0042 333/193 |
| 2004/0080384 A1 | 4/2004 | Takeda | |
| 2005/0110599 A1* | 5/2005 | Kanasaki | H03H 9/0028 333/193 |
| 2013/0187730 A1 | 7/2013 | Nishizawa et al. | |
| 2014/0368296 A1 | 12/2014 | Nishizawa | |
| 2016/0028366 A1 | 1/2016 | Takamine | |

FOREIGN PATENT DOCUMENTS

| | | |
|---|---|---|
| JP | 2007-259430 A | 10/2007 |
| JP | 2013-153289 A | 8/2013 |
| JP | 2015-002511 A | 1/2015 |
| WO | 2014/167752 A1 | 10/2014 |

* cited by examiner

US 10,340,888 B2

ELASTIC WAVE FILTER, DUPLEXER, AND ELASTIC WAVE FILTER MODULE

CROSS REFERENCE TO RELATED APPLICATIONS

This application claims the benefit of priority to Japanese Patent Application No. 2015-225726 filed on Nov. 18, 2015 and is a Continuation Application of PCT Application No. PCT/JP2016/074384 filed on Aug. 22, 2016. The entire contents of each application are hereby incorporated herein by reference.

BACKGROUND OF THE INVENTION

1. Field of the Invention

The present invention relates to an elastic wave filter, a duplexer, and an elastic wave filter module.

2. Description of the Related Art

An elastic wave filter, a duplexer, and an elastic wave device, such as a module including the elastic wave filter and/or the duplexer have been widely used for a mobile communication apparatus, such as a cellular phone.

An existing elastic wave device is disclosed in Japanese Unexamined Patent Application Publication No. 2007-259430, a signal wiring connecting two longitudinally coupled resonator elastic wave filters provided between an input terminal and an output terminal on a piezoelectric substrate and a ground wiring connecting the respective longitudinally coupled resonator elastic wave filters to a ground terminal cross each other three-dimensionally with an insulating film interposed therebetween.

In an elastic wave filter disclosed in Japanese Unexamined Patent Application Publication No. 2015-002511, an input terminal, an output terminal, and an insulating film are formed on a piezoelectric substrate and a ground terminal is formed on the insulating film.

In the elastic wave filters disclosed in Japanese Unexamined Patent Application Publication No. 2007-259430 and Japanese Unexamined Patent Application Publication No. 2015-002511, some signals input from the input terminal become direct waves passing through the piezoelectric substrate and the direct waves propagate to the output terminal in some cases. Therefore, the elastic wave filters disclosed in Japanese Unexamined Patent Application Publication No. 2007-259430 and Japanese Unexamined Patent Application Publication No. 2015-002511 cannot sufficiently increase out-of-band attenuation in some cases.

In a duplexer, an elastic wave filter as a transmission filter and an elastic wave filter as a reception filter are connected in common at the antenna side and a signal leaks from one elastic wave filter into the other elastic wave filter in some cases. In particular, when the elastic wave filter disclosed in Japanese Unexamined Patent Application Publication No. 2007-259430 or Japanese Unexamined Patent Application Publication No. 2015-002511 is used for the duplexer, the direct waves generated in one elastic wave filter leak into the other elastic wave filter in some cases. Accordingly, isolation characteristics of the duplexer are deteriorated in some cases.

SUMMARY OF THE INVENTION

Preferred embodiments of the present invention provide elastic wave filters and elastic wave filter modules capable of making direct waves of a signal difficult to propagate to an output terminal and increasing out-of-band attenuation, and further provide duplexers capable of improving isolation characteristics.

An elastic wave filter according to a preferred embodiment of the present invention includes a piezoelectric substrate, an interdigital transducer (IDT) electrode provided on the piezoelectric substrate, a first shield electrode provided on the piezoelectric substrate, a first insulating film laminated on the piezoelectric substrate so as to extend onto the first shield electrode, a first signal terminal provided on the first insulating film, a second signal terminal provided on the piezoelectric substrate, and a ground terminal provided on the piezoelectric substrate and connected to a ground potential, wherein the first shield electrode is not electrically connected to the IDT electrode and the first and second signal terminals, the first signal terminal is included in the first shield electrode when seen from above, and one of the first signal terminal and the second signal terminal is an output terminal and the other of the first signal terminal and the second signal terminal is an input terminal.

In an elastic wave filter according to a preferred embodiment of the present invention, the ground terminal includes a first ground terminal and the first shield electrode is connected to the first ground terminal. In this case, direct waves of a signal are able to propagate to the first ground terminal. Therefore, the direct waves of the signal are more difficult to propagate to the output terminal and out-of-band attenuation is able to be further increased.

In another specific aspect of an elastic wave filter according to a preferred embodiment of the present invention, at least one ground terminal other than the first ground terminal is provided and the first ground terminal is not connected to the ground terminal and the IDT electrode. In this case, the direct waves of the signal are further made to propagate to the first ground terminal.

In an elastic wave filter according to a preferred embodiment of the present invention, an area of the first shield electrode is larger than an area of the first signal terminal. In this case, an electromagnetic shield effect between the first signal terminal and the piezoelectric substrate is able to be further improved. Therefore, the direct waves of the signal are more difficult to propagate to the output terminal and the out-of-band attenuation is able to be further increased.

In an elastic wave filter according to a preferred embodiment of the present invention, a dielectric constant of the first insulating film is lower than a dielectric constant of the piezoelectric substrate. In this case, the direct waves of the signal are more difficult to propagate to the first insulating film. Therefore, the direct waves of the signal are more difficult to propagate to the output terminal and the out-of-band attenuation is able to be further increased.

In an elastic wave filter according to a preferred embodiment of the present invention, a second shield electrode provided on the piezoelectric substrate and a second insulating film laminated on the piezoelectric substrate so as to extend onto the second shield electrode are further included, and at least one terminal of the second signal terminal and the ground terminal is provided on the second insulating film and the terminal is included in the second shield electrode when seen from above.

In an elastic wave filter according to a preferred embodiment of the present invention, the second signal terminal is provided on the second insulating film. In this case, the first and second shield electrodes provide the electromagnetic shield effect on a portion between the piezoelectric substrate and the first and second signal terminals. Therefore, the direct waves of the signal are more difficult to propagate to the output terminal and the out-of-band attenuation is able to be further increased.

In an elastic wave filter according to a preferred embodiment of the present invention, a plurality of second shield electrodes are provided, a plurality of second insulating films are provided, and a second signal terminal and a ground terminal are respectively provided on the second insulating films. In this case, the direct waves of the signal are more difficult to propagate to the output terminal and the out-of-band attenuation is able to be further increased.

In an elastic wave filter according to a preferred embodiment of the present invention, at least one terminal of the second signal terminal and the ground terminal is provided on a portion in which the second insulating film has been removed.

In an elastic wave filter according to a preferred embodiment of the present invention, all of height positions of respective surfaces of the first and second signal terminals and the ground terminal at an opposite side to the piezoelectric substrate side are at the same or substantially the same positions. In this case, when the elastic wave filter is bonded to a mounting substrate with bumps interposed therebetween, bonding strengths between the respective terminals and the mounting substrate is able to be made uniform.

In an elastic wave filter according to a preferred embodiment of the present invention, an area of the second shield electrode that is overlapped with a terminal when seen from above, of the second signal terminal and the ground terminal which is provided on the second insulating film, is larger than an area of the terminal which is provided on the second insulating layer. In this case, an electromagnetic shield effect between the terminal provided on the second insulating film and the piezoelectric substrate is further enhanced.

In an elastic wave filter according to a preferred embodiment of the present invention, a dielectric constant of the second insulating film is lower than a dielectric constant of the piezoelectric substrate. In this case, the direct waves of the signal are more difficult to propagate to the second insulating film.

In an elastic wave filter according to a preferred embodiment of the present invention, the first signal terminal is an output terminal and the second signal terminal is an input terminal. In this case, the direct waves of the signal are more difficult to propagate to the output terminal and the out-of-band attenuation is further increased.

A duplexer according to a preferred embodiment of the present invention includes a first bandpass filter defined by an elastic wave filter according to a preferred embodiment of the present invention, and a second bandpass filter having a different pass band from the first bandpass filter.

In a duplexer according to a preferred embodiment of the present invention, the first bandpass filter is a reception filter and the second bandpass filter is a transmission filter. In this case, isolation characteristics of the duplexer are effectively improved.

In an elastic wave filter module according to a preferred embodiment of the present invention, a mounting substrate, and an elastic wave filter accordance with a preferred embodiment of the present invention that is mounted on the mounting substrate are included.

In an elastic wave filter module according to a preferred embodiment of the present invention, the first signal terminal of the elastic wave filter is bonded to the mounting substrate with a bump interposed therebetween, and an area of the first shield electrode is larger than an area of a bonded portion between the bump and the first signal terminal. In this case, the first signal terminal and the mounting substrate are bonded to each other more reliably.

In an elastic wave filter module according to a preferred embodiment of the present invention, a mounting substrate, and an elastic wave filter according to a preferred embodiment of the present invention that is mounted on the mounting substrate are included, a second signal terminal and a ground terminal of the elastic wave filter are bonded to the mounting substrate with bumps interposed therebetween, and an area of the second shield electrode that is overlapped with a terminal of the second signal terminal and the ground terminal, which is overlapped with the second shield electrode when seen from above, is larger than an area of a bonded portion between the terminal which is overlapped with the second shield electrode and the bump. In this case, the respective terminals provided on the piezoelectric substrate with the second insulating film and the second shield terminal interposed therebetween and the mounting substrate are bonded to each other more reliably.

Elastic wave filters and elastic wave filter modules according to preferred embodiments of the present invention make direct waves of a signal difficult to propagate to an output terminal. Accordingly, out-of-band attenuation is able to be increased. Duplexer according to preferred embodiments of the present invention are able to improve isolation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that respective preferred embodiments which are described in the specification are exemplary and partial replacement or combination of components between different preferred embodiments may be made.

Figure 1:
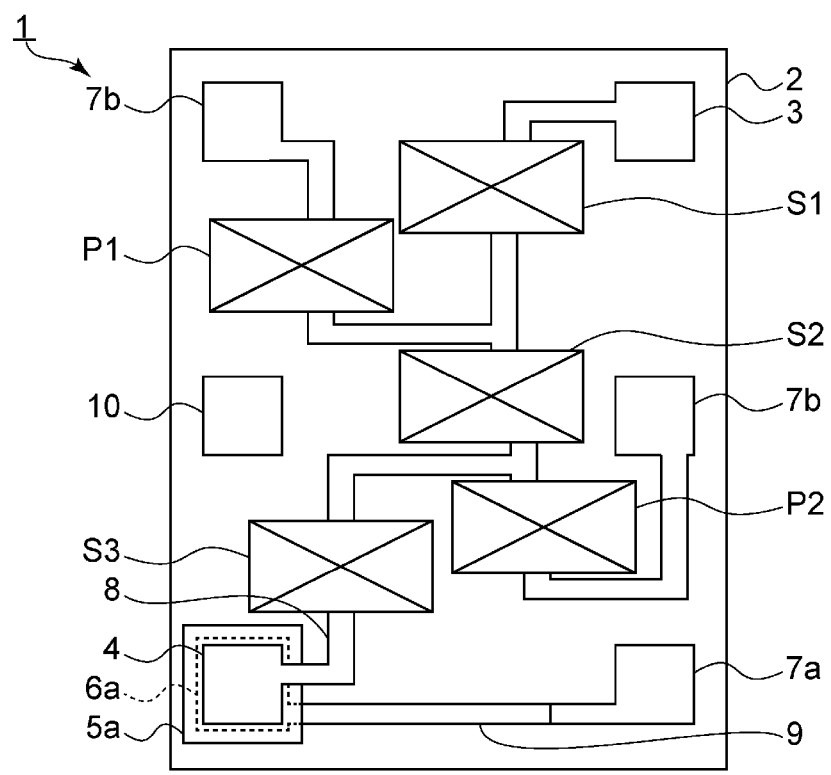
FIG. 1 is a schematic plan view illustrating an electrode structure of an elastic wave filter according to a first preferred embodiment of the present invention.
Figure 2:
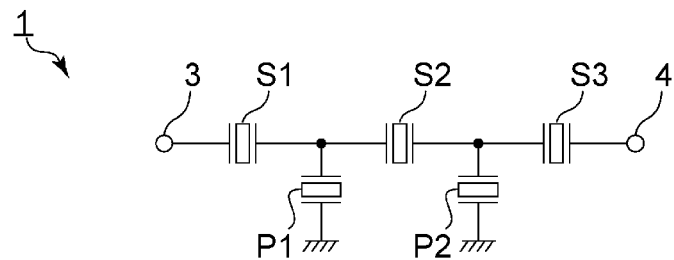
FIG. 2 is a circuit diagram of the elastic wave filter according to the first preferred embodiment of the present invention.

FIG. 1 is a schematic plan view illustrating an electrode structure of an elastic wave filter according to a first preferred embodiment of the present invention. FIG. 2 is a circuit diagram of the elastic wave filter according to the first preferred embodiment. FIG. 1 indicates respective elastic wave resonators with sketches having two diagonal lines in rectangles. The same holds true for FIG. 5, FIGS. 8 to 13, and FIG. 17 which will be described later.

As illustrated in FIG. 1, an elastic wave filter 1 includes a piezoelectric substrate 2. The piezoelectric substrate 2 is preferably made of, for example, piezoelectric single crystal, such as LiNbO$_3$ and LiTaO$_3$ or appropriate piezoelectric ceramics.

The elastic wave filter 1 is preferably a bandpass filter a pass band of which is provided by a plurality of elastic wave resonators. To be more specific, the elastic wave filter 1 includes the elastic wave resonators provided on the piezoelectric substrate 2. A plurality of series arm resonators S1 to S3 and a plurality of parallel arm resonators P1 and P2 are provided as the plurality of elastic wave resonators, and preferably define a ladder filter, for example. Each of the series arm resonators S1 to S3 and each of the parallel arm resonators P1 and P2 include an IDT electrode. The elastic wave filter 1 is not limited to the ladder filter and the number of IDT electrodes is also not particularly limited.

As illustrated in FIG. 1, a first shield electrode 6a is provided on the piezoelectric substrate 2. The thickness of the first shield electrode 6a is not particularly limited but preferably is equal to or larger than about 200 nm and equal to or smaller about than 500 nm, for example, in the present preferred embodiment.

A first insulating film 5a is provided on the piezoelectric substrate 2 so as to extend onto the first shield electrode 6a. The first insulating film 5a covers all or substantially all of the upper surface of the first shield electrode 6a. It is sufficient that the first insulating film 5a electrically insulates the first shield electrode 6a and a signal wiring, which will be described later, from each other, and the first insulating film 5a may not cover all or substantially all of the upper surface of the first shield electrode 6a.

The thickness of the first insulating film 5a is not particularly limited but is preferably about 4000 nm, for example, in the present preferred embodiment. As details will be described later, the first insulating film 5a is preferably made of an insulating material having a dielectric constant which is lower than that of the piezoelectric substrate 2.

A first signal terminal 4 as an output terminal is provided on the first insulating film 5a. The first signal terminal 4 is connected to the series arm resonator S3 with a signal wiring 8 interposed therebetween. The first signal terminal is included in the first shield electrode 6a when seen from above. The first shield electrode 6a provides an electromagnetic shield effect on a portion between the first signal terminal 4 and the piezoelectric substrate 2.

A second signal terminal 3 as an input terminal is directly provided on the piezoelectric substrate 2. It should be noted that the first signal terminal 4 may be the input terminal and the second signal terminal 3 may be the output terminal. Although not particularly limited, the thicknesses of the first and second signal terminals 4 and 3 are preferably about 3000 nm, for example, in the present preferred embodiment.

As illustrated in FIG. 2, the series arm resonators S1 to S3 are connected in series between the first signal terminal 4 and the second signal terminal 3. The parallel arm resonator P1 is connected between a connection point of the series arm resonator S1 and the series arm resonator S2 and a ground potential. The parallel arm resonator P2 is connected between a connection point of the series arm resonator S2 and the series arm resonator S3 and the ground potential.

With reference to FIG. 1, first and second ground terminals 7a and 7b that are connected to the ground potential are provided on the piezoelectric substrate 2. The first ground terminal 7a is not connected to the first and second signal terminals 4 and 3 and the series arm resonators S1 to S3. Although not particularly limited, the first ground terminal 7a is connected to neither of the second ground terminals 7b nor the parallel arm resonators P1 and P2. The first ground terminal 7a is connected to the first shield electrode 6a with a connection wiring 9 interposed therebetween.

The plurality of second ground terminals 7b are provided. The second ground terminals 7b are respectively connected to the parallel arm resonators P1 and P2.

A terminal 10 that is connected to neither of the first and second signal terminals 4 and 3, the series arm resonators S1 to S3, nor the parallel arm resonators P1 and P2 is provided on the piezoelectric substrate 2. The terminal 10 is also not connected to the ground potential. It should be noted that the terminal 10 may not be provided.

Although the elastic wave filter 1 is preferably a ladder filter, for example, the circuit configuration of the elastic wave filter 1 is not particularly limited. The elastic wave filter 1 may be, for example, a longitudinally coupled resonator elastic wave filter.

In the present preferred embodiment, the first signal terminal 4 is included in the first shield electrode 6a when seen from above and the first signal terminal 4 and the first shield electrode 6a are electrically insulated from each other with the first insulating film 5a.

A signal input to the second signal terminal 3 from the outside propagates as direct waves in the piezoelectric substrate 2 without passing through a filter portion defined by the series arm resonators S1 to S3 and the parallel arm resonators P1 and P2. The elastic wave filter 1 is capable of making the direct waves of the signal passing through the piezoelectric substrate 2 difficult to propagate to the first signal terminal 4 and increasing out-of-band attenuation. This effect is described by comparing attenuation-frequency characteristics in the first preferred embodiment and a comparative example with each other.

An elastic wave filter in the comparative example has the same or substantially the same configuration as that of the elastic wave filter 1 in the first preferred embodiment other than the point that it does not include a first shield electrode or a first insulating film.

Figure 3:
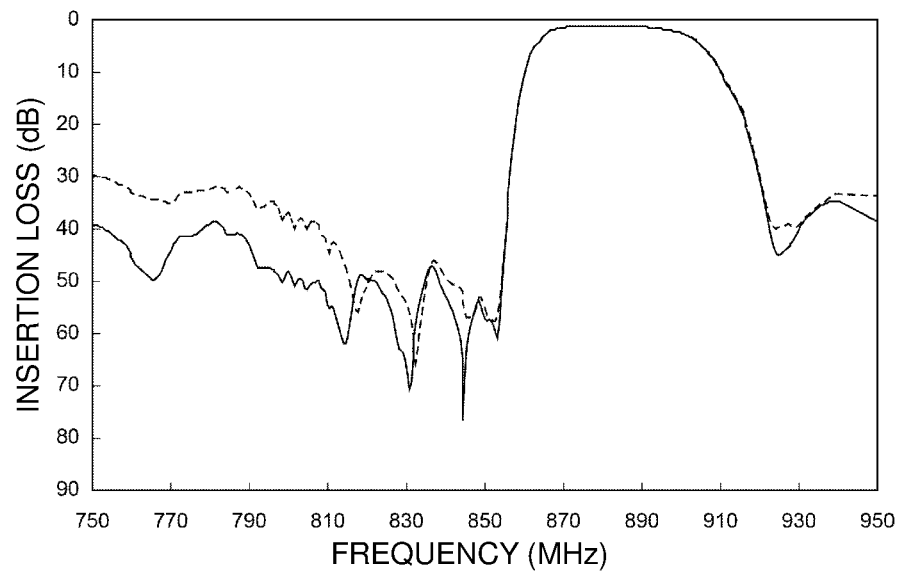
FIG. 3 is a graph illustrating attenuation-frequency characteristics in the first preferred embodiment of the present invention and a comparative example.
Figure 4:
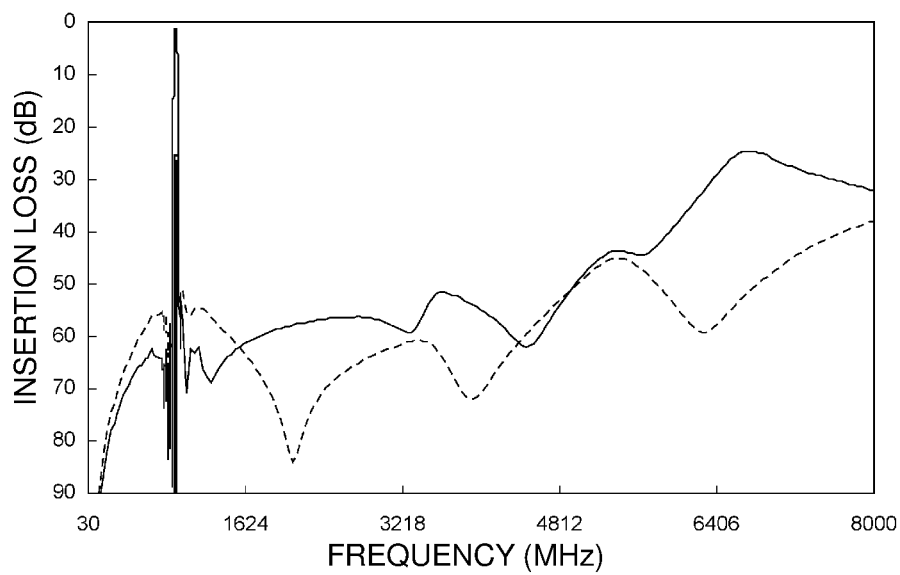
FIG. 4 is a graph illustrating the attenuation-frequency characteristics in the first preferred embodiment of the present invention and the comparative example in a wide frequency band.

FIG. 3 is a graph illustrating the attenuation-frequency characteristics in the first preferred embodiment and the comparative example. FIG. 4 is a graph illustrating the attenuation-frequency characteristics in the first preferred embodiment and the comparative example in a wide frequency band. A solid line indicates a result of the first preferred embodiment. A dashed line indicates a result of the comparative example.

As illustrated in FIG. 3 and FIG. 4, it was discovered that the out-of-band attenuation in the vicinity of a pass band in the first preferred embodiment is larger than the out-of-band attenuation in the comparative example. In the comparative example, propagation of the direct waves of a signal passing through the piezoelectric substrate to the first signal terminal cannot be sufficiently reduced or prevented. Therefore, the out-of-band attenuation of the elastic wave filter is small in the comparative example.

In contrast, in the first preferred embodiment illustrated in FIG. 1, the first shield electrode 6a is provided. The first shield electrode 6a provides the electromagnetic shield effect on a portion between the first signal terminal 4 and the piezoelectric substrate 2. The electromagnetic shield effect makes the direct waves of the signal passing through the piezoelectric substrate 2 difficult to propagate to the first signal terminal 4. Accordingly, the out-of-band attenuation of the elastic wave filter 1 is able to be increased.

Figure 5:
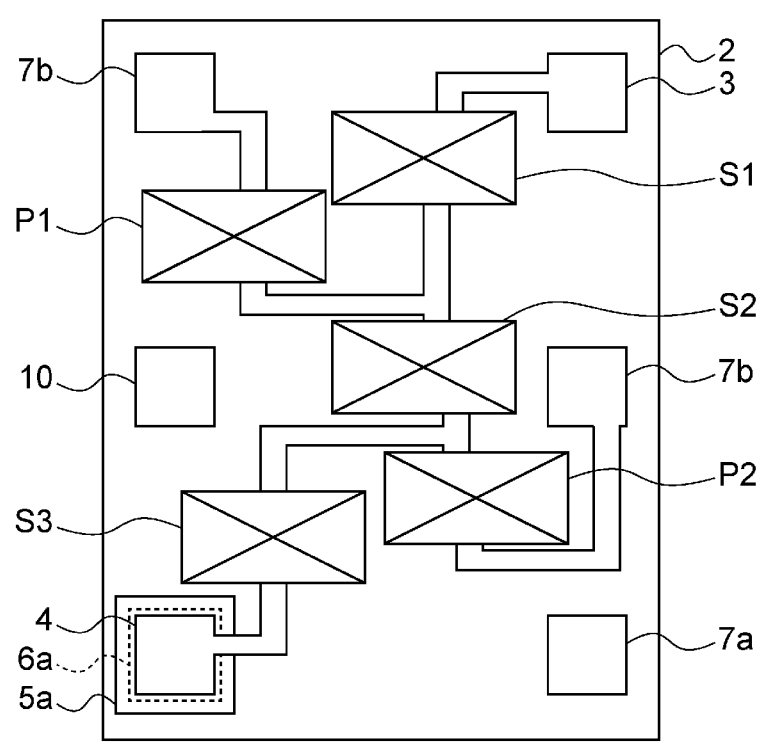
FIG. 5 is a schematic plan view illustrating an electrode structure of an elastic wave filter according to a first variation of the first present preferred embodiment of the present invention.

As in a first variation of the first preferred embodiment illustrated in FIG. 5, the first shield electrode 6a may not be connected to the first ground terminal 7a.

Figure 6A:
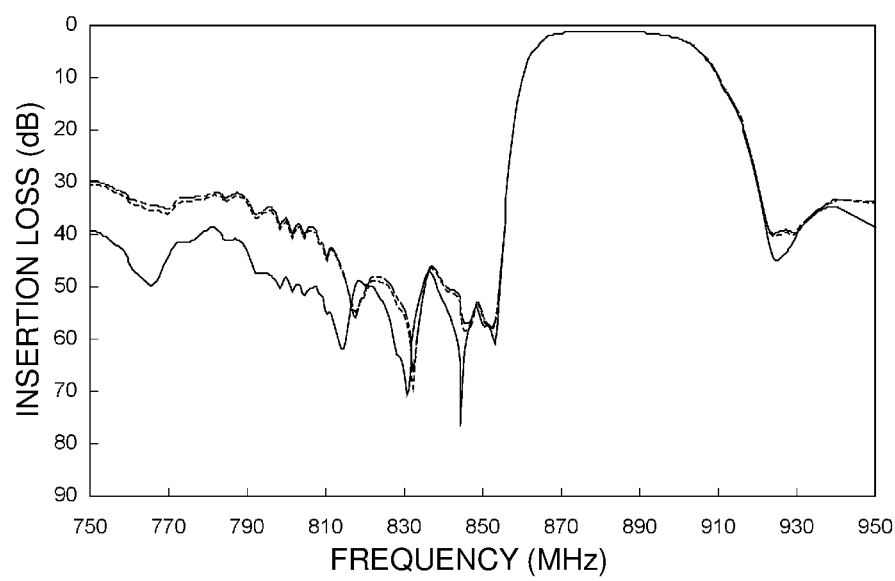
FIG. 6A is a graph illustrating attenuation-frequency characteristics in the first preferred embodiment of the present invention, the first variation of the first preferred embodiment, and the comparative example.
Figure 6B:
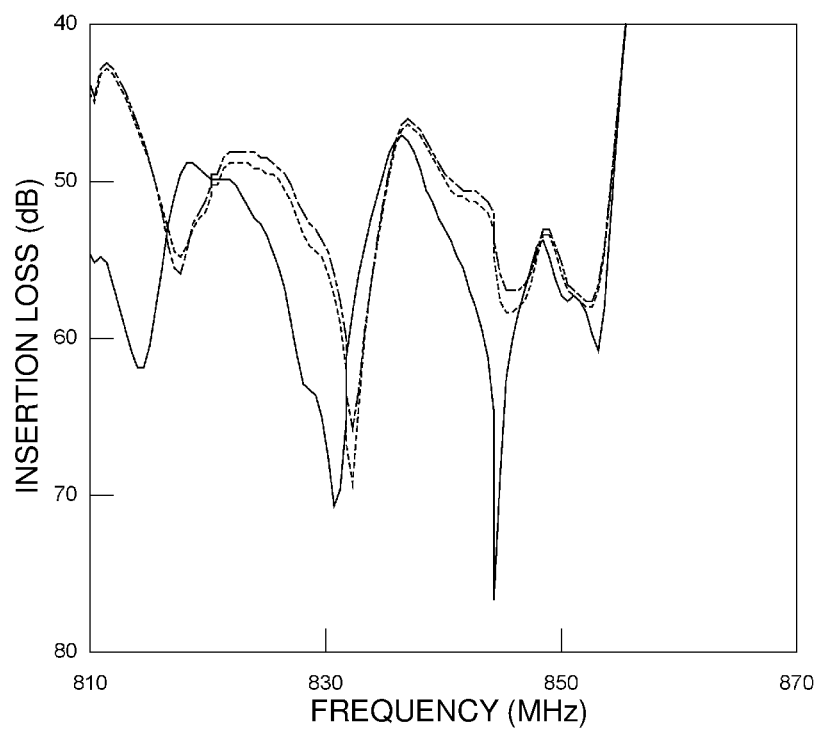
FIG. 6B is an enlarged view of FIG. 6A.
Figure 7:
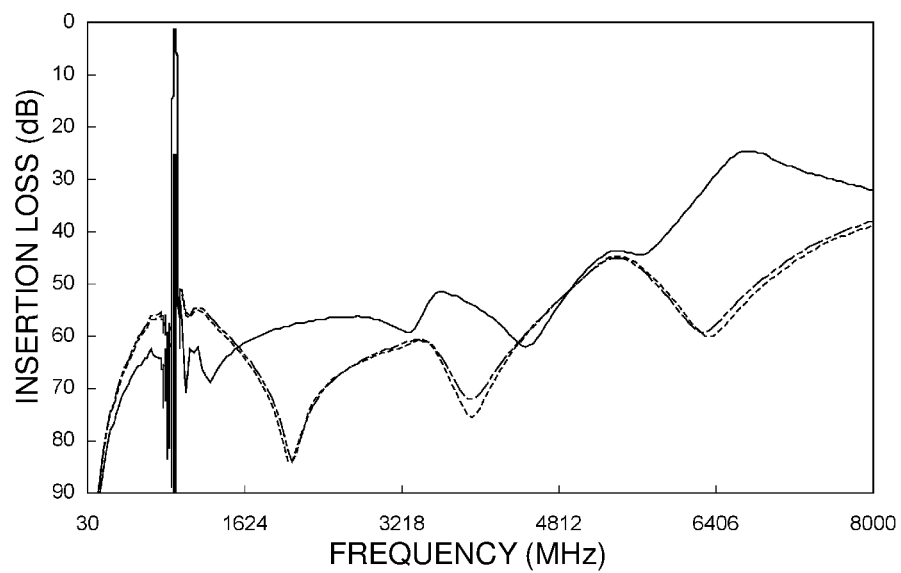
FIG. 7 is a graph illustrating the attenuation-frequency characteristics in the first preferred embodiment of the present invention, the first variation of the first preferred embodiment, and the comparative example in the wide frequency band.

FIG. 6A is a graph illustrating attenuation-frequency characteristics in the first preferred embodiment, the first variation of the first preferred embodiment, and the comparative example. FIG. 6B is an enlarged view of FIG. 6A. FIG. 7 is a graph illustrating the attenuation-frequency characteristics in the first preferred embodiment, the first variation of the first preferred embodiment, and the comparative example in the wide frequency band. A solid line indicates the result of the first preferred embodiment. A dashed line indicates a result of the first variation. A dashed-dotted line indicates the result of the comparative example.

As illustrated in FIGS. 6A, 6B, and 7, the out-of-band attenuation in the first variation of the first preferred embodiment is also able to be increased in comparison with that in the comparative example. Furthermore, in the vicinity of the pass band, the out-of-band attenuation in the first preferred embodiment is much larger than the out-of-band attenuation in the first variation. Thus, it was discovered that the configuration of the first preferred embodiment is more preferable. In the first preferred embodiment illustrated in FIG. 1, the first shield electrode 6a is connected to the first ground terminal 7a. With this connection, the direct waves of the signal that has propagated to the first shield electrode 6a is made to propagate to the ground potential.

In addition, in the first preferred embodiment, the first ground terminal 7a is not electrically connected to the respective second ground terminals 7b and the parallel arm resonators P1 and P2. Therefore, no signal directly flows into the first ground terminal 7a from the parallel arm resonators P1 and P2. The direct waves of the signal are thus easier to propagate to the ground potential from the first shield electrode 6a. Accordingly, in the first preferred embodiment, the direct waves of the signal are more difficult to propagate to the first signal terminal 4.

Figure 8:
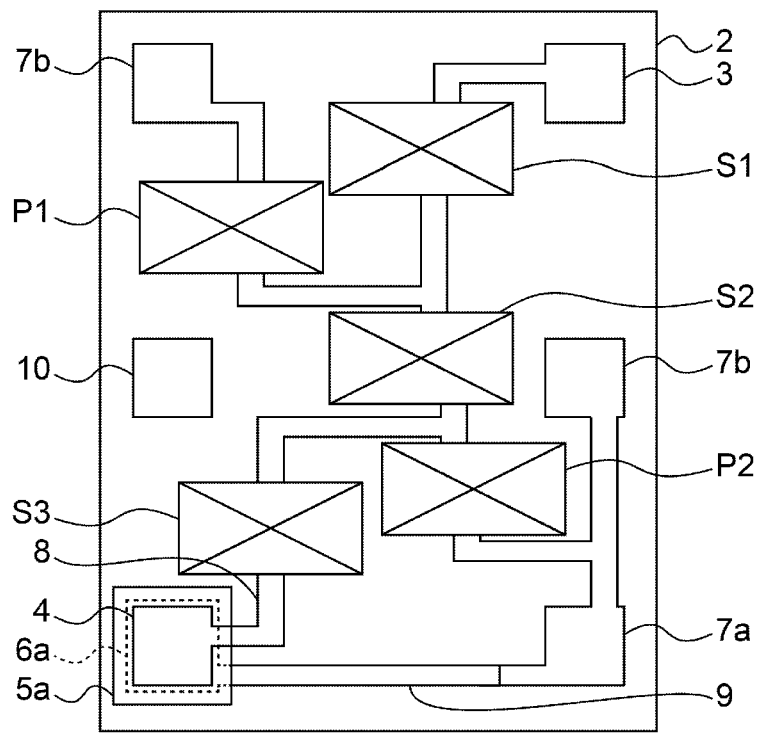
FIG. 8 is a schematic plan view illustrating an electrode structure of an elastic wave filter according to a second variation of the first preferred embodiment of the present invention.
Figure 9:
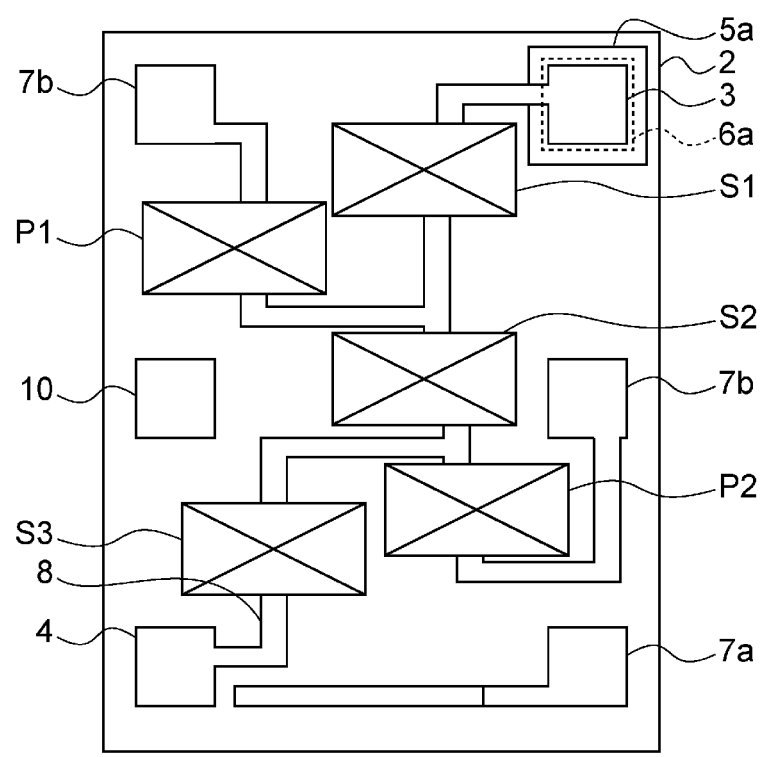
FIG. 9 is a schematic plan view illustrating an electrode structure of an elastic wave filter according to a third variation of the first preferred embodiment of the present invention.

In a second variation of the first preferred embodiment illustrated in FIG. 8, the first shield electrode 6a may be connected to the first ground terminal 7a and the first ground terminal 7a may be connected to the second ground terminal 7b. Also in the second variation, the direct waves of the signal are difficult to propagate to the first signal terminal 4.

In the first preferred embodiment, the first signal terminal 4 as the output terminal is provided above the piezoelectric substrate 2 with the first shield electrode 6a and the first insulating film 5a interposed therebetween. As in a third variation of the first preferred embodiment illustrated in FIG. 9, the second signal terminal 3 as the input terminal may be provided on the piezoelectric substrate 2 with the first shield electrode 6a and the first insulating film 5a interposed therebetween.

The dielectric constant of the first insulating film 5a illustrated in FIG. 1 is preferably lower than the dielectric constant of the piezoelectric substrate 2. The direct waves of the signal are thus more difficult to propagate to the first insulating film 5a.

It should be noted that an insulating film other than the first insulating film 5a may be provided between the first shield electrode 6a and the piezoelectric substrate 2. The dielectric constant of the insulating film is also preferably lower than the dielectric constant of the piezoelectric substrate 2. Also in this case, the direct waves of the signal are more difficult to propagate to the first signal terminal 4.

The area of the first shield electrode 6a is preferably larger than the area of the first signal terminal 4. The electromagnetic shield effect between the first signal terminal 4 and the piezoelectric substrate 2 is thus further improved.

A non-limiting example of a method for manufacturing the elastic wave filter 1 according to the first preferred embodiment will be described below.

Figure 10A:
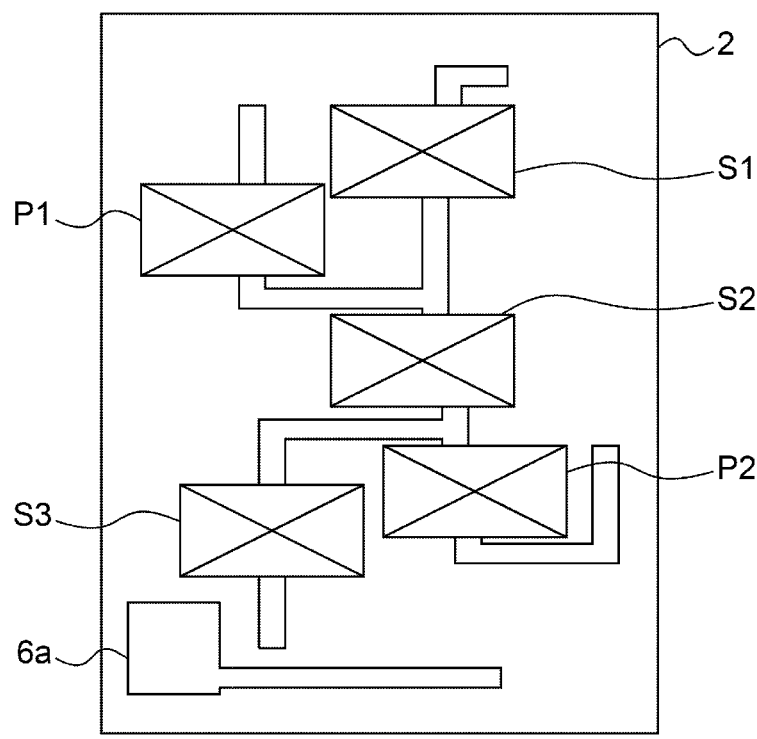
FIGS. 10A and 10B are schematic plan views for explaining a method for manufacturing the elastic wave filter according to the first preferred embodiment of the present invention.
Figure 10B:
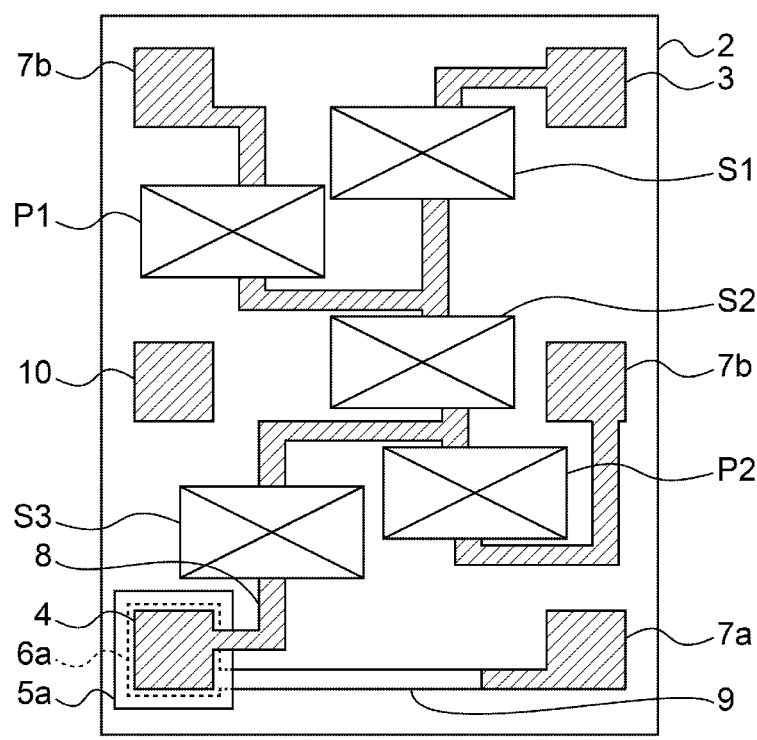

FIGS. 10A and 10B are schematic plan views for explaining the method for manufacturing the elastic wave filter according to the first preferred embodiment. Hatched portions in FIG. 10B indicate electrodes formed in a process illustrated in FIG. 10B.

As illustrated in FIG. 10A, the piezoelectric substrate 2 is prepared. Then, a first electrode layer is formed on the piezoelectric substrate 2. To be more specific, the first shield electrode 6a, the plurality of IDT electrodes, and wirings connecting the plurality of IDT electrodes are formed. At this time, portions of the signal wiring and the connection wiring are also formed. The first electrode layer may be formed by, for example, a sputtering method, a CVD method, or other suitable method.

Subsequently, as illustrated in FIG. 10B, the first insulating film 5a is formed on the piezoelectric substrate 2 so as to cover the upper surface of the first shield electrode 6a. The first insulating film 5a may also be formed by, for example, the sputtering method, the CVD method, or other suitable method.

Then, second electrode layers are formed on the piezoelectric substrate 2, the first insulating film 5a, and the first electrode layer. To be more specific, the first and second signal terminals 4 and 3, the first and second ground terminals 7a and 7b, the signal wiring 8, the connection wiring 9, and the wirings connecting the plurality of IDT electrodes are formed. The second electrode layer may be formed by, for example, the sputtering method, the CVD method, or other suitable method.

The first shield electrode 6a and the plurality of IDT electrodes are simultaneously provided, so as to improve productivity.

Figure 11:
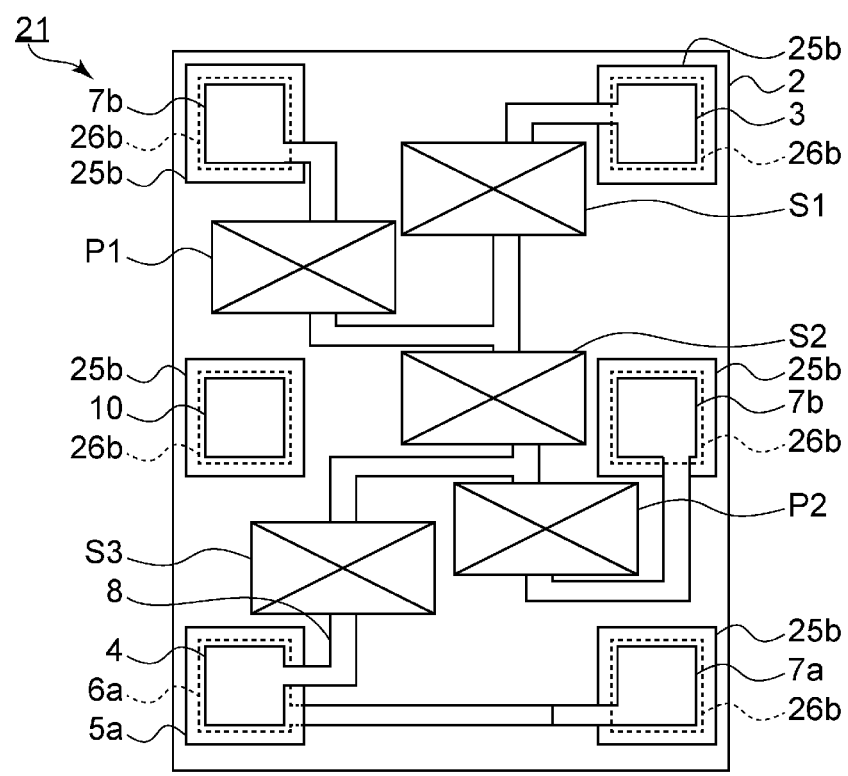
FIG. 11 is a schematic plan view illustrating an electrode structure of an elastic wave filter according to a second preferred embodiment of the present invention.

FIG. 11 is a schematic plan view illustrating an electrode structure of an elastic wave filter according to a second preferred embodiment of the present invention.

In an elastic wave filter 21, all of the terminals of the first and second signal terminals 4 and 3, the first and second ground terminals 7a and 7b, and the terminal 10 are provided on the piezoelectric substrate 2 with shield electrodes and insulating films interposed therebetween. The elastic wave filter 21 preferably has the same or substantially the same configuration as that of the elastic wave filter in the first preferred embodiment other than the above-described point.

To be more specific, the elastic wave filter 21 includes a plurality of second shield electrodes 26b and a plurality of second insulating films 25b. The plurality of second shield electrodes 26b indicated by dashed lines are provided on the piezoelectric substrate 2. The second insulating films 25b are each laminated on the piezoelectric substrate 2 so as to extend onto the respective second shield electrodes 26b. The second signal terminal 3, the first and second ground terminals 7a and 7b, and the terminal 10 are respectively provided on the second insulating films 25b. The second shield electrodes 26b may preferably be made of the same material as that of the first shield electrode 6a. The second insulating films 25b may preferably be made of the same material as that of the first insulating film 5a.

Although not particularly limited, in the present preferred embodiment, the thicknesses of the plurality of second shield electrodes 26b are preferably the same or substantially the same as the thickness of the first shield electrode 6a. Similarly, the thicknesses of the plurality of second insulating films 25b are preferably the same or substantially the same as the thickness of the first insulating film 5a. Furthermore, the thicknesses of the first and second signal terminal 4 and 3, the first and second ground terminals 7a and 7b, and the terminal 10 are preferably the same or substantially the same. Therefore, all of the height positions of the respective surfaces of the first and second signal terminal 4 and 3, the first and second ground terminals 7a and 7b, and the terminal 10 at the opposite side to the piezoelectric substrate 2 side are preferably the same or substantially the same.

The height position is a position in the height direction that is perpendicular or substantially perpendicular to the main surface of the piezoelectric substrate 2 on which the first insulating film 5a are laminated.

The elastic wave filter 21 may be mounted on a mounting substrate. In this case, for example, the respective surfaces of the first and second signal terminal 4 and 3, the first and second ground terminals 7a and 7b, and the terminal 10 at the opposite side to the piezoelectric substrate 2 side are bonded to the mounting substrate with bumps interposed therebetween. Here, the side of the respective terminals, which is opposite to the piezoelectric substrate 2 side, is the mounting side. In this case, all of the height positions of the respective mounting-side surfaces of the terminals are the same or substantially the same, so that bonding strengths between the terminals and the mounting substrate is uniform or substantially uniform.

In addition, in the present preferred embodiment, the first and second signal terminals 4 and 3 are provided on the piezoelectric substrate 2 with the first and second insulating films 5a and 25b and the first and second shield electrodes 6a and 26b interposed therebetween, respectively. The first and second shield electrodes 6a and 26b therefore provide electromagnetic shield effects on a portion between the piezoelectric substrate 2 and the first and second signal terminals 4 and 3. In addition to the effect obtained in the first preferred embodiment, propagation of a signal to the piezoelectric substrate 2 from the second signal terminal 3 as the input terminal is also able to be reduced or prevented. Accordingly, direct waves of the signal are more difficult to propagate to the first signal terminal 4.

The dielectric constants of the second insulating films 25b are preferably lower than the dielectric constant of the piezoelectric substrate 2 as in the case of the first insulating film 5a. The direct waves of the signal are thus more difficult to propagate to the second insulating films 25b. Therefore, propagation of the signal to the piezoelectric substrate 2 from the second signal terminal 3 is able to be further reduced or prevented.

A non-limiting example of a method for manufacturing the elastic wave filter 21 according to the second preferred embodiment will be described below.

Figure 12A:
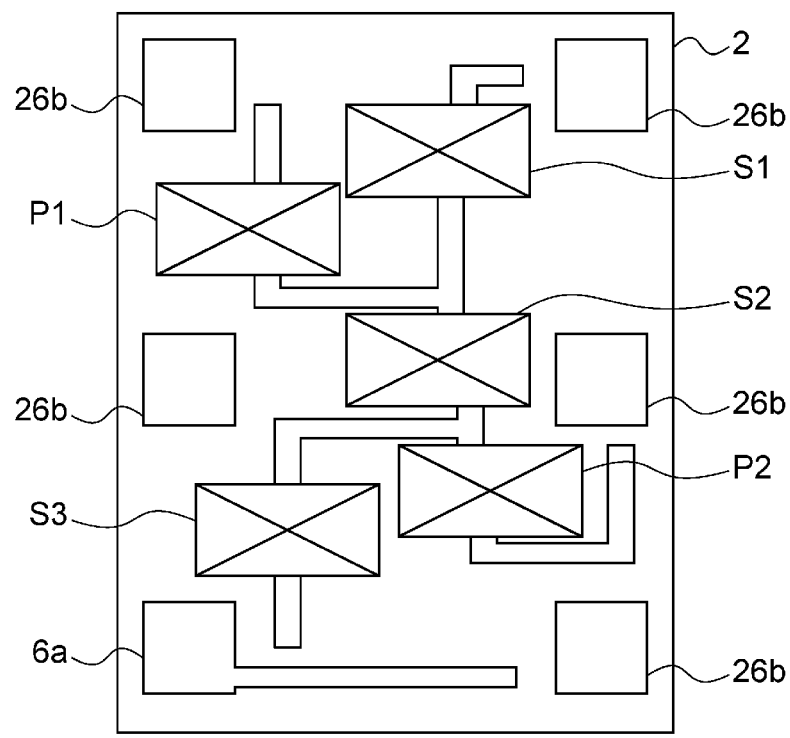
FIGS. 12A and 12B are schematic plan views for explaining a method for manufacturing the elastic wave filter according to the second preferred embodiment of the present invention.
Figure 12B:
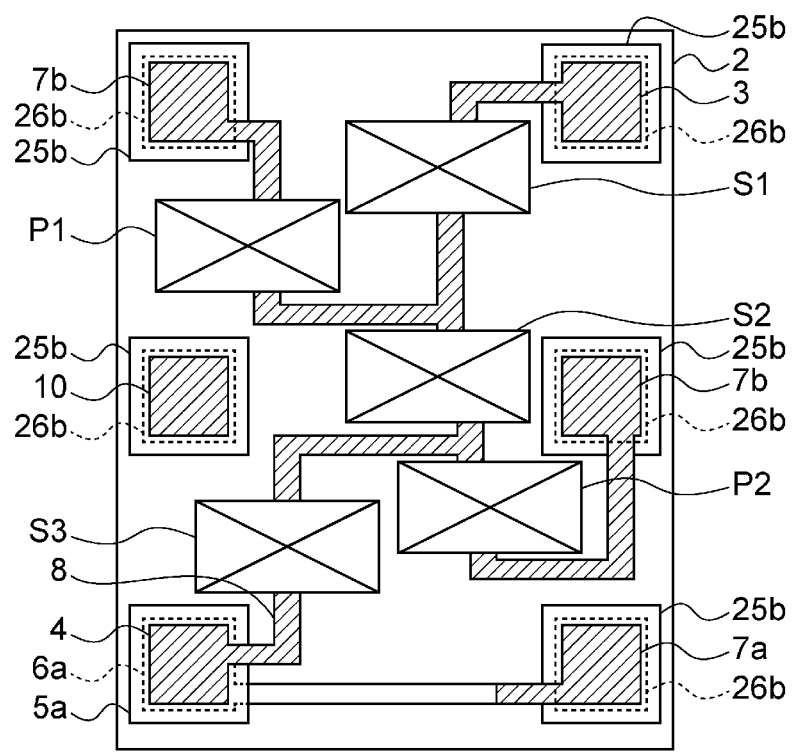

FIGS. 12A and 12B are schematic plan views for explaining the method for manufacturing the elastic wave filter according to the second preferred embodiment. Hatched portions in FIG. 12B indicate electrodes formed in a process illustrated in FIG. 12B.

As illustrated in FIG. 12A, a first electrode layer is formed on the piezoelectric substrate 2 in the same or substantially the same manner as the first preferred embodiment. The plurality of second shield electrodes 26b are also formed as in the first electrode layer Subsequently, as illustrated in FIG. 12B, the first and second insulating films 5a and 25b are formed. To be more specific, the first insulating film 5a is formed on the piezoelectric substrate 2 so as to cover the upper surface of the first shield electrode 6a. The plurality of second insulating films 25b are formed on the piezoelectric substrate 2 so as to cover the respective upper surfaces of the second shield electrodes 26b. Then, a second electrode layer is formed in the same or substantially the same manner as in the first preferred embodiment.

Figure 13:
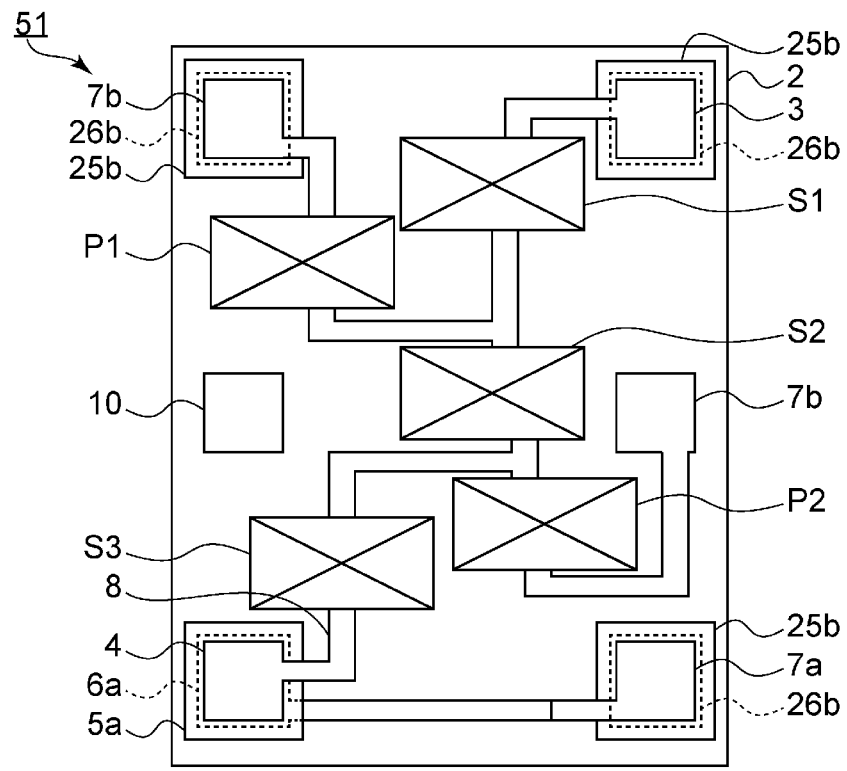
FIG. 13 is a schematic plan view illustrating an electrode structure of an elastic wave filter according to a variation of the second preferred embodiment of the present invention.

As in a variation of the second preferred embodiment illustrated in FIG. 13, the terminal 10 and one of the plurality of second ground terminals 7b may be provided on portions in which the second insulating films 25b have been removed. In this case, the mounting-side surface of the terminal 10 of an elastic wave filter 51 is located at the piezoelectric substrate 2 side relative to the respective mounting-side surfaces of the terminals provided on the piezoelectric substrate 2 with the second shield electrodes 26b and the second insulating films 25b interposed therebetween. In the same or substantially the same manner, the mounting-side surface of the second ground terminal 7b that is directly provided on the piezoelectric substrate 2 is also located at the piezoelectric substrate 2 side relative to the respective mounting-side surfaces of the terminals other than the terminal 10.

For example, a mounting substrate on which the elastic wave filter 51 is mounted may be warped in some cases. In this case, the height positions of the respective mounting-side surfaces of the terminals of the elastic wave filter 51 have positional relationships corresponding to the warpage of the mounting substrate. Accordingly, bonding strength between the respective terminals and the mounting substrate is able to be made uniform or substantially uniform so as to correspond to the warpage of the mounting substrate.

It should be noted that the present invention is not limited to the variation of the second preferred embodiment illustrated in FIG. 13, and at least one terminal of the second signal terminal 3, the first and second ground terminals 7a and 7b, and the terminal 10 may be provided on a portion in which the second insulating film 25b has been removed. In this manner, the height positions of the respective terminals are able to be adjusted so as to correspond to the warpage of the mounting substrate.

Preferred embodiments of the present invention are not limited to elastic wave filters and may also preferably be applied to a duplexer. This will be described below.

Figure 14:
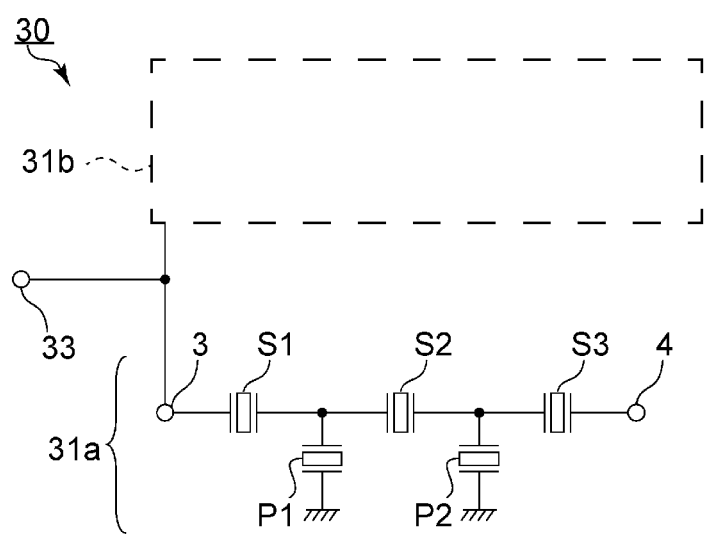
FIG. 14 is a circuit diagram of a duplexer according to a third preferred embodiment of the present invention.

FIG. 14 is a circuit diagram of a duplexer according to a third preferred embodiment of the present invention.

Although not particularly limited, a duplexer 30 preferably has a pass band of Band 5, for example. To be more specific, a transmission band of the duplexer 30 is preferably equal to or higher than 824 MHz and equal to or lower than 849 MHz, for example. A reception band of the duplexer 30 is preferably equal to or higher than 869 MHz and equal to or lower than 894 MHz, for example.

The duplexer 30 includes a first bandpass filter 31a having the same or substantially the same configuration as that in the first preferred embodiment. Although the first bandpass filter 31a is preferably the ladder filter, for example, the circuit configuration thereof is not particularly limited. The first bandpass filter 31a may be, for example, a longitudinally coupled resonator elastic wave filter.

The duplexer 30 includes a second bandpass filter 31b having a pass band which is different from that of the first bandpass filter 31a. The circuit configuration of the second bandpass filter 31b is not particularly limited and is indicated by a region with a dashed line in FIG. 14. The second bandpass filter 31b may be, for example, a ladder filter or a longitudinally coupled resonator filter.

The duplexer 30 includes an antenna terminal 33 that is connected to an antenna. The first bandpass filter 31a and the second bandpass filter 31b are connected in common to the antenna terminal 33.

In the present preferred embodiment, preferably, the first bandpass filter 31a is a reception filter and the second bandpass filter 31b is a transmission filter. It should be noted that the first bandpass filter 31a may be the transmission filter and the second bandpass filter 31b may be the reception filter.

An effect obtained achieved by the third preferred embodiment will be described below by comparing duplexers according to the third preferred embodiment and a comparative example with each other. The duplexer in the comparative example has the same or substantially the same configuration as that of the duplexer 30 in the third preferred embodiment other than the point that a reception filter does not include a first shield electrode and a first insulating film.

Figure 15:
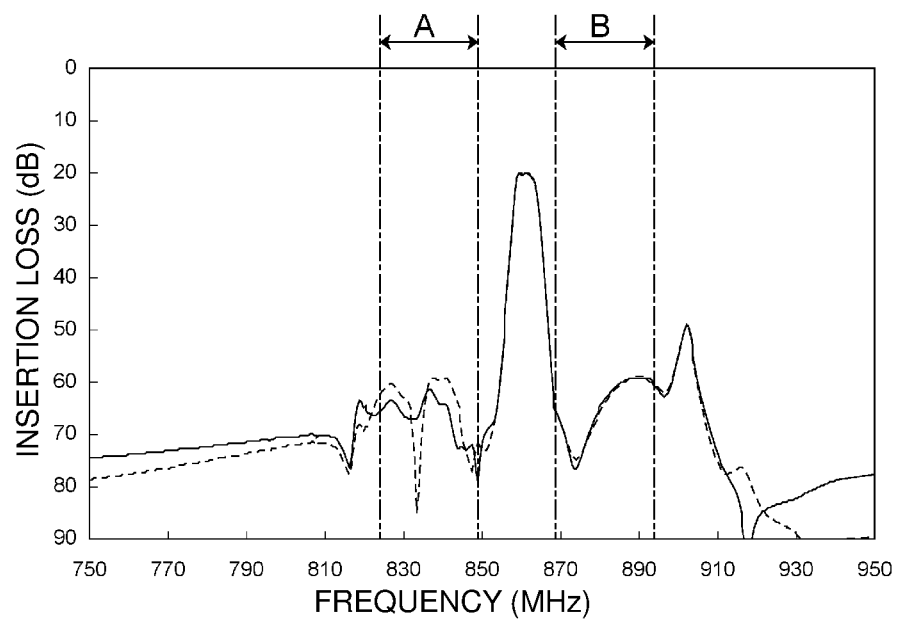
FIG. 15 is a graph illustrating isolation characteristics of duplexers in the third preferred embodiment of the invention and a comparative example.

FIG. 15 is a graph illustrating isolation characteristics of the duplexers according to the third preferred embodiment and the comparative example. A region A in FIG. 15 indicates transmission bands of the duplexers in the third preferred embodiment and the comparative example. A region B indicates reception bands of the duplexers in the third preferred embodiment and the comparative example. A solid line indicates a result of the third preferred embodiment. A dashed line indicates a result of the comparative example.

As illustrated in FIG. 15, the attenuation in the transmission band in the third preferred embodiment is larger than that in the comparative example. Therefore, it was discovered that the duplexer in the third preferred embodiment improves the isolation characteristics.

With reference to FIG. 14, a signal leaking from the second bandpass filter 31b flows into the first bandpass filter 31a from the second signal terminal 3 in some cases. In the present preferred embodiment, the first shield electrode provides an electromagnetic shield effect on a portion between the piezoelectric substrate and the first signal terminal 4 as in the first preferred embodiment. Therefore, also in the case of an occurrence of the above-described leaking of the signal, direct waves of the signal are more difficult to propagate to the first signal terminal 4. Accordingly, the isolation characteristics of the duplexer 30 are improved.

The above-described leaking of the signal tends to occur in the reception filter rather than in the transmission filter. Accordingly, the present preferred embodiment improves the isolation characteristics.

A duplexer in a variation of the third preferred embodiment in which the first bandpass filter has the configuration according to the first variation of the first preferred embodiment illustrated in FIG. 5 also improves the isolation characteristics.

Figure 16A:
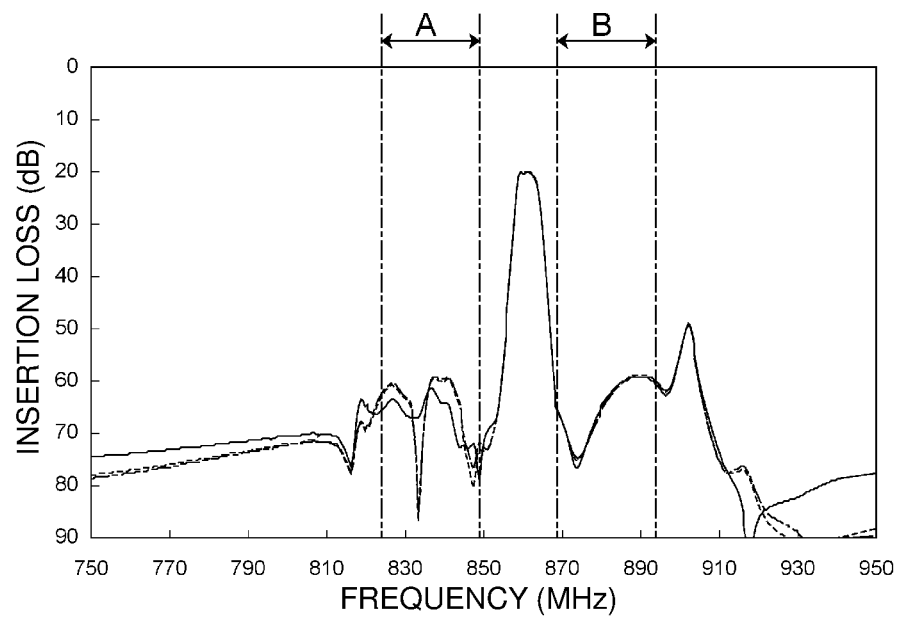
FIG. 16A is a graph illustrating isolation characteristics in the third preferred embodiment of the present invention, a variation of the third preferred embodiment, and a comparative example.
Figure 16B:
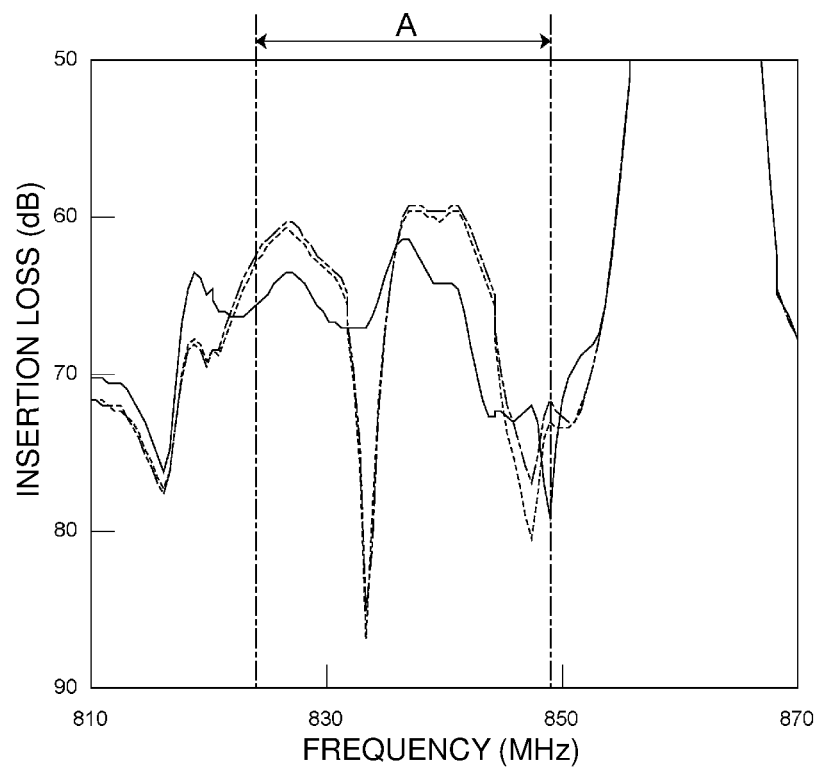
FIG. 16B is an enlarged view of FIG. 16A.

FIG. 16A is a graph illustrating the isolation characteristics in the third preferred embodiment, the variation of the third preferred embodiment, and the comparative example. FIG. 16B is an enlarged view of FIG. 16A. A solid line indicates a result of the third preferred embodiment. A dashed line indicates a result of the variation. A dashed-dotted line indicates a result of the comparative example.

As illustrated in FIGS. 16A and 16B, the variation of the third preferred embodiment improves the isolation characteristics. Furthermore, the isolation characteristics are further improved in the third preferred embodiment as compared to that in the variation.

The duplexer 30 illustrated in FIG. 14 may preferably be structured as one chip in which the first and second bandpass filters 31a and 31b are provided on the same piezoelectric substrate. Alternatively, the duplexer 30 may be structured as a plurality of chips in which the first bandpass filter 31a and the second bandpass filter 31b are provided on different piezoelectric substrates.

The duplexer 30 may be mounted on a mounting substrate. In this case, the antenna terminal 33 may be provided on the mounting substrate. It is sufficient that the first and second bandpass filters 31a and 31b are electrically connected to the antenna terminal 33 in a state in which the first and second bandpass filters 31a and 31b are mounted on the mounting substrate.

As described above, an elastic wave filter according to a preferred embodiment of the present invention may be mounted on the mounting substrate. Therefore, preferred embodiments of the present invention may also preferably be applied to an elastic wave filter module. This will be described below.

Figure 17:
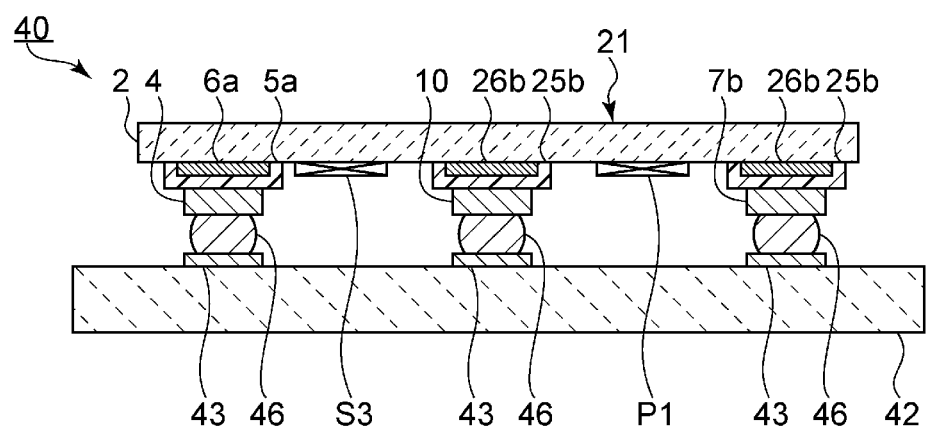
FIG. 17 is a front cross-sectional view of an elastic wave filter module according to a fourth preferred embodiment of the present invention.

FIG. 17 is a front cross-sectional view of an elastic wave filter module according to a fourth preferred embodiment of the present invention.

An elastic wave filter module 40 includes a mounting substrate 42. The elastic wave filter 21 having the same or substantially the same configuration as that in the second preferred embodiment is mounted on the mounting substrate 42. To be more specific, a plurality of mounting terminals 43 are provided on the mounting substrate 42. The first signal terminal 4, the terminal 10, and the second ground terminals 7b are bonded to the respective mounting terminals 43 with bumps 46 interposed therebetween. Although not illustrated in the drawing, the second signal terminal and the first ground terminal are also bonded to the respective mounting terminals 43 with the bumps 46 interposed therebetween.

Also in the present preferred embodiment, direct waves of a signal are difficult to propagate to the first signal terminal 4 and out-of-band attenuation is able to be increased.

The surface of the first insulating film 5a at the mounting substrate 42 side preferably has particularly high flatness in a portion in which the first insulating film 5a is provided on the first shield electrode 6a. A portion of the first signal terminal 4, which is provided on the portion of the first insulating film 5a having high flatness, preferably has particularly high flatness.

In the elastic wave filter module 40, the area of the first shield electrode 6a is preferably larger than the area of a bonded portion between the bump 46 and the first signal terminal 4. The areas of the portions of the first insulating film 5a and the first signal terminal 4, which have high flatness, is thus increased. Accordingly, when the elastic wave filter 21 is mounted on the mounting substrate 42, the first signal terminal 4 and the mounting terminal 43 are able to be more reliably bonded to each other with the bump 46 interposed therebetween.

The second signal terminal 3, the first and second ground terminals 7a and 7b, and the terminal 10 illustrated in FIG. 11 are overlapped with the respective second shield electrodes 26b when seen from above. The areas of the second shield electrodes 26b that are overlapped with the respective terminals are preferably larger than the areas of bonded portions between the terminals and the bumps 46. Therefore, the respective terminals and the mounting terminals 43 are able to be more reliably bonded to each other with the bumps interposed therebetween.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter comprising:
   a piezoelectric substrate;
   an IDT electrode provided on the piezoelectric substrate;
   a first shield electrode provided on the piezoelectric substrate;
   a first insulating film laminated on the piezoelectric substrate and extending onto the first shield electrode;
   a first signal terminal provided on the first insulating film;
   a second signal terminal provided on the piezoelectric substrate; and
   a ground terminal provided on the piezoelectric substrate and connected to a ground potential; wherein
   the first shield electrode is not electrically connected to the IDT electrode and the first and second signal terminals;
   the first signal terminal is included in the first shield electrode when seen from above; and
   one of the first signal terminal and the second signal terminal is an output terminal and the other of the first signal terminal and the second signal terminal is an input terminal.

2. The elastic wave filter according to claim 1, wherein the ground terminal includes a first ground terminal, and the first shield electrode is connected to the first ground terminal.

3. The elastic wave filter according to claim 2, wherein at least one additional ground terminal other than the first ground terminal is provided and the first ground terminal is not connected to the additional ground terminal and the IDT electrode.

4. The elastic wave filter according to claim 1, wherein an area of the first shield electrode is larger than an area of the first signal terminal.

5. The elastic wave filter according to claim 1, wherein a dielectric constant of the first insulating film is lower than a dielectric constant of the piezoelectric substrate.

6. The elastic wave filter according to claim 1, further comprising:
   a second shield electrode provided on the piezoelectric substrate; and
   a second insulating film laminated on the piezoelectric substrate so as to extend onto the second shield electrode;
   wherein
   at least one terminal of the second signal terminal and the ground terminal is provided on the second insulating film and the terminal is included in the second shield electrode when seen from above.

7. The elastic wave filter according to claim 6, wherein the second signal terminal is provided on the second insulating film.

8. The elastic wave filter according to claim 7, wherein a plurality of the second shield electrodes are provided, a plurality of the second insulating films are provided, and the second signal terminal and the ground terminal are respectively provided on the plurality of second insulating films.

9. The elastic wave filter according to claim 8, wherein all of height positions of respective surfaces of the first and second signal terminals and the ground terminal at an opposite side to the piezoelectric substrate side are the same or substantially the same.

10. The elastic wave filter according to claim 6, wherein at least one terminal of the second signal terminal and the ground terminal is provided on a portion in which the second insulating film has been removed.

11. The elastic wave filter according to claim 6, wherein an area of the second shield electrode that is overlapped with the terminal when seen from above, of the second signal terminal and the ground terminal, which is provided on the second insulating film, is larger than an area of the at least one terminal which is provided on the second insulating layer.

12. The elastic wave filter according to claim 6, wherein a dielectric constant of the second insulating film is lower than a dielectric constant of the piezoelectric substrate.

13. An elastic wave filter module comprising:
   a mounting substrate; and
   the elastic wave filter according to claim 6 mounted on the mounting substrate; wherein the second signal terminal and the ground terminal of the elastic wave filter are bonded to the mounting substrate with bumps interposed therebetween; and an area of the second shield electrode that is overlapped with the terminal of the second signal terminal and the ground terminal, which is overlapped with the second shield electrode when seen from above, is larger than an area of a bonded portion between the terminal which is overlapped with the second shield electrode and the bump.

14. A duplexer comprising:

a first bandpass filter defined by the elastic wave filter according to claim 1; and a second bandpass filter having a different pass band from the first bandpass filter.

15. The duplexer according to claim 14, wherein the first bandpass filter is a reception filter and the second bandpass filter is a transmission filter.

16. The duplexer according to claim 14, wherein an area of the first shield electrode is larger than an area of the first signal terminal.

17. The duplexer according to claim 14, wherein a dielectric constant of the first insulating film is lower than a dielectric constant of the piezoelectric substrate.

18. An elastic wave filter module comprising:

a mounting substrate; and the elastic wave filter according to claim 1 mounted on the mounting substrate.

19. The elastic wave filter module according to claim 18, wherein the first signal terminal of the elastic wave filter is bonded to the mounting substrate with a bump interposed therebetween; and an area of the first shield electrode is larger than an area of a bonded portion between the bump and the first signal terminal.

20. The elastic wave filter according to claim 1, wherein the first signal terminal is an output terminal and the second signal terminal is an input terminal.

* * * * *